(12) United States Patent
Vo et al.

(10) Patent No.: US 8,010,510 B1
(45) Date of Patent: Aug. 30, 2011

(54) METHOD AND SYSTEM FOR TOKENIZED STREAM COMPRESSION

(75) Inventors: Binh Vo, Mountain View, CA (US); Gurmeet Singii Manku, Mountain View, CA (US)

(73) Assignee: Google Inc., Mountain View, CA (US)

( * ) Notice: Subject to any disclaimer, the term of this patent is extended or adjusted under 35 U.S.C. 154(b) by 485 days.

(21) Appl. No.: 12/167,116

(22) Filed: Jul. 2, 2008

Related U.S. Application Data (60) Provisional application No. 60/947,931, filed on Jul. 3, 2007.

(51) Int. Cl.
*G06F 7/00* (2006.01)
*G06F 17/30* (2006.01)
(52) U.S. Cl. ................................................ 707/693
(58) Field of Classification Search .................. None
See application file for complete search history.

(56) References Cited

OTHER PUBLICATIONS

Nelson, "Data Compression with the Burrows-Wheeler Transform", Dr. Dobbs Journal, Sep. 1996, Accessed online at http://dogma.net/markn/articles/bwt/bwt.htm on Nov. 7, 2010.*
Bihn et al., "RadixZip: linear time compression of token streams", VLDB '07 Proceedings of the 33rd international conference on Very large data bases, pp. 1162-1172, 2007, ACM.*
Bin Muhammad, Rashid, "Radix Sort" Kent State University, Kent, OH [online] <URL: http://www.personal.kent.edu/~rmuhamma/Algorithms/MyAlgorithms/Sorting/radixSort.htm> [retrieved Jun. 6, 2007], 2 pages.
Coenen, Franz, "Stream Tokenizing (and More File Handling)" University of Liverpool, Liverpool, UK [online] May 12, 2000 <URL: http://www.csc.liv.ac.uk/~frans/OldLectures/COMP101/AdditionalStuff/tokenizing2.html> [retrieved Aug. 7, 2009], 7 pages.
Covington, Michael, "ET: An Efficient Tokenizer in ISO Prolog" University of Georgia, Athens, GA [online] Feb. 12, 2003 <URL: http://www.ai.uga.edu/mc/ET/et.pdf> [retrieved Aug. 7, 2009], 8 pages.
"Huffman Coding" Wikipedia, the Free Encyclopedia [online] Nov. 2004 <URL: http://en.wikipedia.org/wiki/Huffman_coding> [retrieved Mar. 25, 2009], 5 pages.
Vo, Binh Dao et al., "Using Column Dependency to Compress Tables" *Proceedings of the Conference on Data Compression*, Snowbird, UT, 2004, pp. 92-102.

* cited by examiner

*Primary Examiner* — Michael Hicks
(74) *Attorney, Agent, or Firm* — Fish & Richardson P.C.

(57) ABSTRACT

A tokenized stream including n tokens, each token including two or more portions, is received and a first sort order based on a sort of a set of the first portions of the n tokens is determined. The first sort order is applied to reorder a set of the second portions of the n tokens. The above steps are repeated to determine a sort order based on a set of portions of the n tokens and to apply the sort order to another set of portions of the n tokens column until a $c^{th}$ set of portions been reordered by a $(c-1)^{th}$ sort order. The variable c is a desired number of sets to be sorted. The variables c and n are whole numbers and the n tokens are dispersed during reordering.

45 Claims, 3 Drawing Sheets

METHOD AND SYSTEM FOR TOKENIZED STREAM COMPRESSION

CROSS-REFERENCE TO RELATED APPLICATIONS

This application claims priority to U.S. Provisional Application No. 60/947,931, filed on Jul. 3, 2007, entitled "METHOD AND SYSTEM FOR TOKENIZED STREAM COMPRESSION," the entire contents of which are incorporated herein by reference.

TECHNICAL FIELD

This invention relates to data manipulation.

BACKGROUND

Many data sources can be divided into streams by attribute. Streams can be further divided into tokens. For example, a web server log is an example of a record stream that can be transposed into multiple attribute streams. Another example is a database containing a number of tables with streams of entries classified by attribute. Database warehouses and logging systems can be required to store very large volumes of data. The overall infrastructure cost for log storage and analysis is typically proportional to the total number of bytes occupied by log files. Good compression techniques can therefore reduce the overall infrastructure cost. One example of a compressor that can be used with tokenized streams is known as the bzip2 compressor. The bzip2 compressor uses a sorter known as the Burrows-Wheeler Transform.

SUMMARY

This invention relates to a data sort methods, apparatus and systems. In general, in one aspect, the invention features (a) receiving a tokenized stream of content including n tokens; (b) arranging the content into c columns and n rows, where c is a maximum token length of the n tokens included in the stream; (c) determining a first sort order based on a sort of a first column; and (d) applying the first sort order to reorder a second column. Steps (c) and (d) are repeated to determine a sort order based on one column and apply the sort order to another column until the $c^{th}$ column has been reordered by a $(c-1)^{th}$ sort order. The variables c and n are whole numbers and the n tokens are dispersed during reordering.

Implementations of the invention can include one or more of the following features. The $i^{th}$ column can include an $i^{th}$ byte of a token in the stream. In another example, the $i^{th}$ column can include an $i^{th}$ portion of a multi-portioned token in the stream. The $i^{th}$ portion can be a text string, numeric string or character, to name a few examples. Determining a sort order based on a sort of a column can include resolving a tie based on a sort order of a previous column. In one example, the stream includes n fixed-length tokens having a length c. In another example, the stream includes n variable-length tokens, each token having a length not greater than c. An output stream including the sorted columns arranged as a string can be provided. In one example, the output stream is provided to a compressor. In a particular implementation, the output stream is provided to a move-to-front coder to generate a second output, which can be provided to a run-length coder to generate a third output, which third output can be provided to a Group-Huffman coder to generate a fourth output.

In general, in another aspect, the invention features: (a) receiving a tokenized stream including n tokens, each token having two or more portions; (b) determining a first sort order based on a sort of a set of the first portions of the n tokens; and (c) applying the first sort order to reorder a set of the second portions of the n tokens. Steps (b) and (c) are repeated to determine a sort order based on a set of portions of the n tokens and to apply the sort order to another set of portions of the n tokens column until a $c^{th}$ set of portions been reordered by a $(c-1)^{th}$ sort order, where c is a desired number of sets to be sorted. The variables c and n are whole numbers and the n tokens are dispersed during reordering.

In general, in another aspect, the invention features receiving a tokenized stream of content including n tokens, arranging the content into a matrix of c columns and n rows, where c is a maximum token length of the n tokens and reordering each of (c−1) of the columns, where each reordering is based on sort orders of all previously reordered columns in the matrix. The n tokens are dispersed during the reordering and c and n are whole numbers.

Implementations of the invention can include one or more of the following features. An $i^{th}$ column can include the $i^{th}$ byte of tokens in the stream, or an $i^{th}$ column can include an $i^{th}$ portion of a multi-portioned token in the stream. By way of example, the $i^{th}$ portion can be a text string or a numeric string. Reordering (c−1) of the columns based on sort-orders of all previous columns can include resolving a tie based on an order of an adjacent previously-ordered column. In one example, reordering (c−1) of the columns based on sort-orders of all previous columns includes: (a) determining an $x^{th}$ sort order based on a sort of an $x^{th}$ column; (b) applying the $x^{th}$ sort order to reorder an adjacent $(x+1)^{th}$ column; and (c) repeating steps (a) and (b) until the $c^{th}$ column has been reordered by a $(c-1)^{th}$ order, where x is a whole number.

In general, in another aspect, the invention features a system including a compression sorter and a compressor. The compression sorter is configured to: receive a tokenized stream of b bytes including n tokens; arrange the b bytes into a matrix of c columns by n rows, where c is a maximum token length of the n tokens; reorder each of (c−1) of the columns, where each reordering is based on sort orders of all previously reordered columns in the matrix; and provide an output stream comprising the reordered columns. The n tokens are dispersed during the reordering and b, c and n are whole numbers. The compressor is configured to receive and compress the output stream.

In some implementations, the compressor includes a move-to-front coder, and can further include a run-length coder, and/or a Group-Huffman coder.

Implementations of the invention can realize none, one or more of the following advantages. A compression sorter and techniques proposed herein can use radix sorting, which improves over known suffix sorting algorithms. For example, the compression sorter proposed rearranges only one column at a time, whereas a suffix sort can move bytes from anywhere in an input to anywhere else. Restricting byte movement to a smaller range can decrease cache misses. A compression sorter is provided that can employ a simple radix sort while rearranging input bytes allowing for faster sorting than conventional linear time suffix sorting algorithms. The simplicity of the compression sorter proposed is less likely to include bugs or present security holes when implemented.

The compression sorter proposed can require less memory than a linear time suffix sorting algorithm. Linear time suffix sorting algorithms require state for the entire input. The best known linear time algorithm requires three integers per input byte. The compression sort described can store only two permutations, which are written back and forth as the process iterates over the columns. Each permutation can be an array of size equal to the number of tokens, thus the proposed compression sort requires only two integers per input token. For most reasonable tokenizations, the number of tokens will be many times smaller than the number of bytes. Smaller memory requirements and a linear time algorithm allow the compression sorter to be practical for larger block sizes than conventional compression sorts.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Methods, apparatus, computer programs and a system for sorting a tokenized stream are described. In one implementation, the sorting can be performed in a pre-processing step to compressing the tokenized stream. For example, the Burrows-Wheeler Transform in the bzip2 compressor for tokenized streams can be replaced with a compression sorter performing the sorting techniques described herein. An output stream from the compression sorter can be used with other compressors or for applications other than compression.

A tokenized stream of b bytes including n tokens can be arranged into a matrix of c columns and n rows, where c is a maximum token length of the n tokens. An $i^{th}$ column includes the $i^{th}$ byte of tokens in the stream. All columns other than the first column to be processed are reordered based on sort-orders of all previously reordered columns in the matrix. The n tokens are dispersed during the reordering. That is, tokens do not remain intact during the reordering; each column is reordered independently. The variables b, c, i and n are whole numbers.

In one implementation, reordering a column, e.g., column x, based on sort-orders of all previous columns includes treating as a set of strings of length (x−1) the content of all preceding columns, e.g., columns 1 to (x−1). In one example these strings are sorted using last character most significant order and the resulting sort order is applied to re-order column x.

In another implementation, which is generally more efficient particularly when dealing with large volumes of data, the algorithm described below is applied to reorder the columns. Applying the algorithm has the effect of reordering a row based on sort-orders of all previous columns in the matrix.

Figure 1:
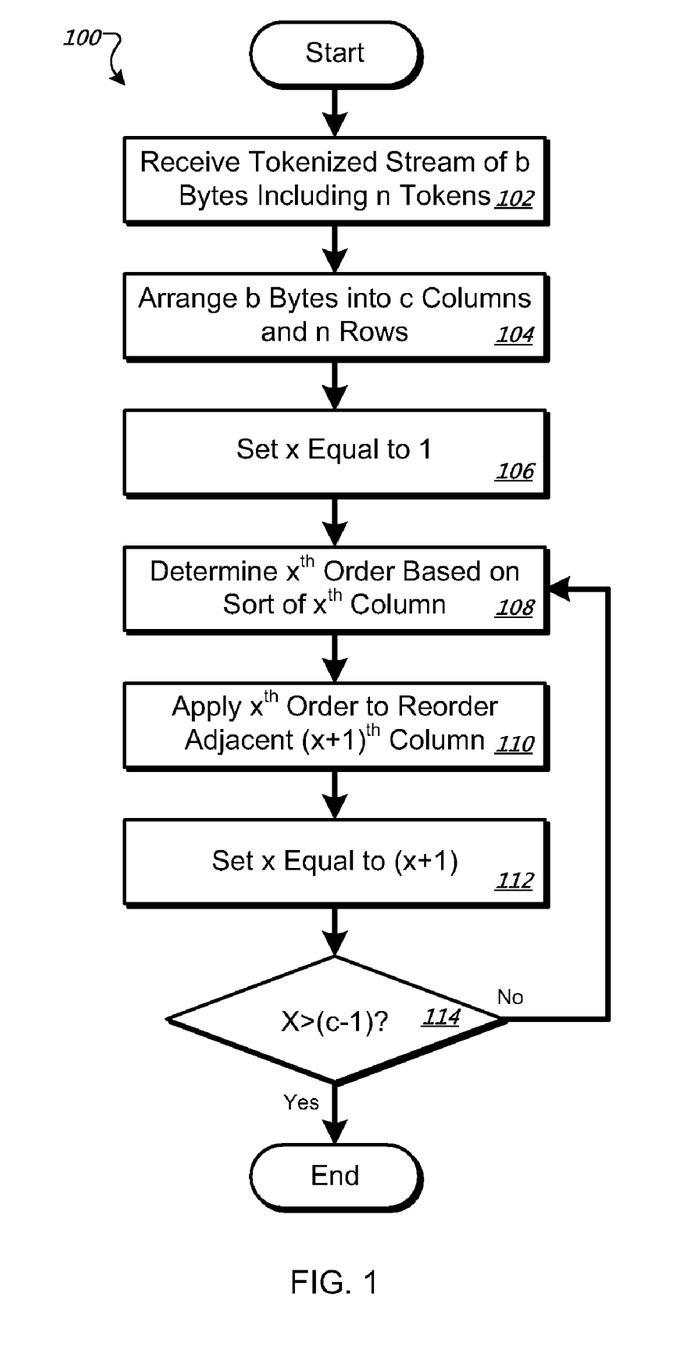
FIG. 1 is a flow chart of an example process for sorting a tokenized stream.

FIG. 1 is a flow chart of an example process 100 for sorting a tokenized stream. The process 100 begins with receiving (Step 102) a tokenized stream of b bytes including n tokens.

In some implementations, the process 100 receives tokens having a fixed length. For example, a fixed length tokenized stream can include the following tokens:

HOUSE HEART MOVER HOUSE HEART MOVER

In this example, there are six tokens and each token has a length of five characters for a total of thirty characters. In some implementations, each character can be represented in a computer memory using one byte of storage (e.g., thirty bytes in this example). Alternatively, a larger or smaller memory size can be used. In some implementations, the tokenized stream is delimited by a particular character or value, such as spaces, tab characters, or null characters.

In another example, the process 100 can receive tokens having a variable width. For example, a variable width tokenized stream can include the following tokens:

HOUSE\0 HEAR\0 MOV\0 HOUSE\0 HEAR\0 MOV\0

In this example, there are six tokens. The first and fourth tokens have a width of six including the null character (\0) that is used as a token delimiter. The second and fifth tokens have a width of five including the null character (\0). The third and sixth tokens have a width of four including the null character (\0).

While examples described herein use terms such as "character" and "byte," other types of tokens can be used. For example, a group of characters or bytes within a token can be identified for sorting. In addition, other representations of data can be used, such as integers, floating point numbers, image pixel data, or other data. In addition, a first token can be of a first type, such as text, while a second token is of a second type, such as a floating point number. In some implementations, a token can include structured data, such as a Transmission Control Protocol/Internet Protocol (TCP/IP) address (e.g., 64.233.167.99) or a telephone number (e.g., 612-766-2010).

Referring again to FIG. 1, the process 100 arranges the b bytes into c columns and n rows (Step 104), where c is a maximum token length. For example, the fixed length tokenized stream can be arranged into the following five columns and six rows:

| H | O | U | S | E |
| H | E | A | R | T |
| M | O | V | E | R |
| H | O | U | S | E |
| H | E | A | R | T |
| M | O | V | E | R |

The variable length stream can be arranged into the following six columns and six rows:

| H | O | U | S | E  | \0 |
| H | E | A | R | \0 |    |
| M | O | V | \0|    |    |
| H | O | U | S | E  | \0 |
| H | E | A | R | \0 |    |
| M | O | V | \0|    |    |

In some implementations, the rows of tokens can be transposed into columns. For example, where a sort or an arranging is performed on a column of data, transposing the columns into rows and performing the sort or arranging on the rows can decrease the time in which a computer processor performs the sort or arranging.

The process 100 loops through the columns. For example, the process 100 can set a counter (x) equal to one (Step 106), indicating that the first column is selected.

The process 100 determines an $x^{th}$ sort order based on a sort of an $x^{th}$ column (Step 108). For example, the following is a sort of the first column in the fixed length and the variable length streams:

HHHHMM

The sort order can be represented using the following notation:

125346

The notation above indicates that the first character moves to the $1^{st}$ position, the second character moves to the $2^{nd}$ position, the third character moves to the $5^{th}$ position, the fourth character moves to the $3^{rd}$ position, the fifth character moves to the $4^{th}$ position, and the sixth character moves to the $6^{th}$ position. In general, the sorting performed is a stable sort method. That is, where ties occur, the original order of the characters is preserved (e.g., the "M" originally in the $3^{rd}$ position is moved to the $5^{th}$ position ahead of the "M" in the $6^{th}$ position). In some implementations, the sort performed is a radix sort. The radix sort can be a least significant digit (LSD) radix sort (e.g., a numeric style radix sort), a most significant digit (MSD) radix sort (e.g., a text style sort), or a combination of sort types. For example, a first column can include numeric data sorted using an LSD radix sort and a second column can include text data sorted using an MSD radix sort. Alternatively, another type of stable sort can be used.

The process 100 applies the $x^{th}$ sort order to reorder another column. In the particular example process shown, the other column is an adjacent $(x+1)^{th}$ column (Step 110). In general, the first column to be processed is output without being reordered. Subsequent columns are reordered based on a sort of the previous column. Alternatively, the process 100 can use the $x^{th}$ order to arrange a non-adjacent column. The process 100 can store an indicator of the column that the $x^{th}$ order applies to or the process 100 can have a rule other than $(x+1)$, such as $(x+2)$. In the fixed length and variable length stream examples, the process 100 applies the "125346" order to the second column to determine the following output:

OEOEOO

The entire output thus far in the fixed length and variable length examples is the following:

HHMHHM OEOEOO

In some implementations, the process 100 also sorts the output of the first column. For example, the process 100 can have a predetermined sort order for the first column or the process 100 can output sort information for the first column.

The process 100 selects the next column (e.g., sets x equal to x+1) (Step 112). If there is another column (114) (e.g., x>c−1), then the process 100 determines the $(x+1)^{th}$ sort order based on a sort of the $(x+1)^{th}$ column. For example, the second column can be sorted to obtain the following order:

EEOOOO

In some implementations, where a tie occurs (e.g., the four occurrences of "O"), the process 100 can order the characters based on the order of the previous column. For example, an "O" in "HOUSE" can occur before an "O" in "MOVER" because "H" occurs before "M." That is, by preserving the sort-order of the previous column when sorting a current column keeps state from all prior columns.

The order of "EEOOOO" can be represented using the following notation:

315426

The notation above indicates that the character in the first position moves to the $3^{rd}$ position, the character in the second position moves to the $1^{st}$ position, the character in the third position moves to the $5^{th}$ position, the character in the fourth position moves to the $4^{th}$ position, the character in the fifth position moves to the $2^{nd}$ position, and the character in the sixth position moves to the $6^{th}$ position. The order "315426" is applied to the third column to determine the following output:

AAUUVV

The entire output thus far in the fixed length and variable length examples is the following:

HHMHHM OEOEOO AAUUVV

In the fixed length and variable length examples, the order of the third column is represented using the following notation:

315426

In the fixed length example, the order "315426" is applied to the fourth column to determine the following output:

RRSSEE

The entire output thus far in the fixed length example is the following:

HHMHHM OEOEOO AAUUVV RRSSEE

In the fixed length example the order of the fourth column is represented using the following notation:

531642

The order "531642" is applied to the fifth column to determine the following output:

RRTTEE

The entire output thus far in the fixed length stream example is the following:

HHMHHM OEOEOO AAUUVV RRSSEE R RTTEE

In the variable length example, the order "315426" is applied to the fourth column to determine the following output:

RRSS\0\0

The entire output thus far in the variable length example is the following:

HHMHHM OEOEOO AAUUVV RRSS\0\0

In the variable length example the order of the fourth column is represented using the following notation:

531642

The order "531642" is applied to the fifth column to determine the output. However, the fifth column does not have data for the two MOV\0 rows (e.g., the third and sixth positions in the order "531642"). Where data does not exist, the order for that position is skipped. Therefore, the 1 and the 2 in the order "531642" are skipped when the order is applied to the fifth column to determine the following output:

\0\0 EE

The entire output thus far in the fixed length stream example is the following:

HHMHHM OEOEOO AAUUVVR RSS\0\0\0\0EE

In the variable length example the order of the fifth column is represented using the following notation:

315426

In the variable length example, the order "315426" is applied to the sixth column to determine the following output:

\0\0

The entire output thus far in the variable length example is the following:

HHMHHM OEOEOO AAUUVVR RSS\0\0\0\0E \0\0

The output from the process 100 can be provided to one or more compression algorithms such as move-to-front coding, run-length coding, and Group-Huffman coding. The compression can be reversed and the process 100 can be reversed to retrieve the original tokenized stream.

For example, the output of the fixed length example can be tokenized again to form the following columns and rows:

| H | O | A | R | R |
| H | E | A | R | R |
| M | O | U | S | T |
| H | E | U | S | T |

-continued

| | | | | |
|---|---|---|---|---|
| H | O | V | E | E |
| M | O | V | E | E |

The first column is sorted to determine the following reverse order:

125346

When reversing the sort, the order notation above represents moving the character in the $1^{st}$ position to the first position, moving the character in the $2^{nd}$ position to the second position, moving the character in the $5^{th}$ position to the third position, moving the character in the $3^{rd}$ position to the fourth position, moving the character in the $4^{th}$ position to the fifth position, and moving the character in the $6^{th}$ position to the sixth position. The reverse order "125346" is applied to the second column to determine the following output:

OEOOEO

The second column is sorted to determine the following reverse order:

315426

The reverse order "315426" is applied to the third column to determine the following output:

UAVUAV

The third column is sorted to determine the following reverse order:

315426

The reverse order "315426" is applied to the fourth column to determine the following output:

SRESRE

The fourth column is sorted to determine the following reverse order:

531642

The reverse order "531642" is applied to the fifth column to determine the following output:

ETRETR

The entire output after reversing the sort on the fixed length example is the original tokenized stream:

HOUSE HEART MOVER HOUSE HEART MOVER

It should be understood, that although in the above example (and in further examples below) the matrix is processed from left to right, the reverse order can be applied to produce similarly desirous results. That is, the rightmost column can be column "1" and the leftmost column can be column "c", and the columns can be processed from 1 to c moving from right to left. In another implementation, the columns can be processed in an order other than either left to right or right to left.

Referring again to the variable length example, the number of original tokens can be determined by counting the number of token delimiters (e.g., the number of null characters). There are six null characters in the sorted output from the variable length example. Therefore there are at most six characters in each column. The first six characters (HHMHHM) are read from the sorted output as the first column.

| |
|---|
| H |
| H |
| M |
| H |
| H |
| M |

The first column is sorted to determine the following reverse order:

125346

The reverse order "125346" is applied to the next six characters (OEOEOO) to determine the second column as in the following:

| | |
|---|---|
| H | O |
| H | E |
| M | O |
| H | O |
| H | E |
| M | O |

The reverse order "315426" is applied to the next six characters (AAUUVV) to determine the third column as in the following:

| | | |
|---|---|---|
| H | O | U |
| H | E | A |
| M | O | V |
| H | O | U |
| H | E | A |
| M | O | V |

The third column is sorted to determine the following reverse order:

315426

The reverse order "315426" is applied to the next six characters (RRSS\0\0) to determine the fourth column as in the following:

| | | | |
|---|---|---|---|
| H | O | U | S |
| H | E | A | R |
| M | O | V | \0 |
| H | O | U | S |
| H | E | A | R |
| M | O | V | \0 |

The fourth column is sorted to determine the following reverse order:

531642

The fourth column includes two null characters. The null characters indicate that two rows are complete. Therefore, only four characters (\0\0EE) are read from the sorted output. Blank characters can be added to the four characters to act as placeholders in the fifth column (blank blank \0\0EE). The blank characters can be placed so as to coincide with the complete rows after the reverse sort is applied. The reverse order "531642" is applied to the fifth column to determine the following output:

| | | | | |
|---|---|---|---|---|
| H | O | U | S | E |
| H | E | A | R | \0 |
| M | O | V | \0 | |
| H | O | U | S | E |
| H | E | A | R | \0 |
| M | O | V | \0 | |

The fifth column is sorted to determine the following reverse order:

315426

The fifth column includes two null characters and two missing characters. The null and missing characters indicate that four rows are complete. Therefore, only two characters \0) are read from the sorted output. Blank characters can be added to the two characters to act as placeholders in the sixth column (blank blank \0 \0 blank blank). The reverse order "315426" is applied to the sixth column to determine the following output:

| H | O | U | S | E | \0 |
| H | E | A | R | \0 |    |
| M | O | V | \0 |    |    |
| H | O | U | S | E | \0 |
| H | E | A | R | \0 |    |
| M | O | V | \0 |    |    |

The entire output after reversing the sort on the variable length example is the original tokenized stream:

HOUSE\0 HEAR\0 MOV\0 HOUSE\0 HEAR\0 MOV\0

Figure 2:
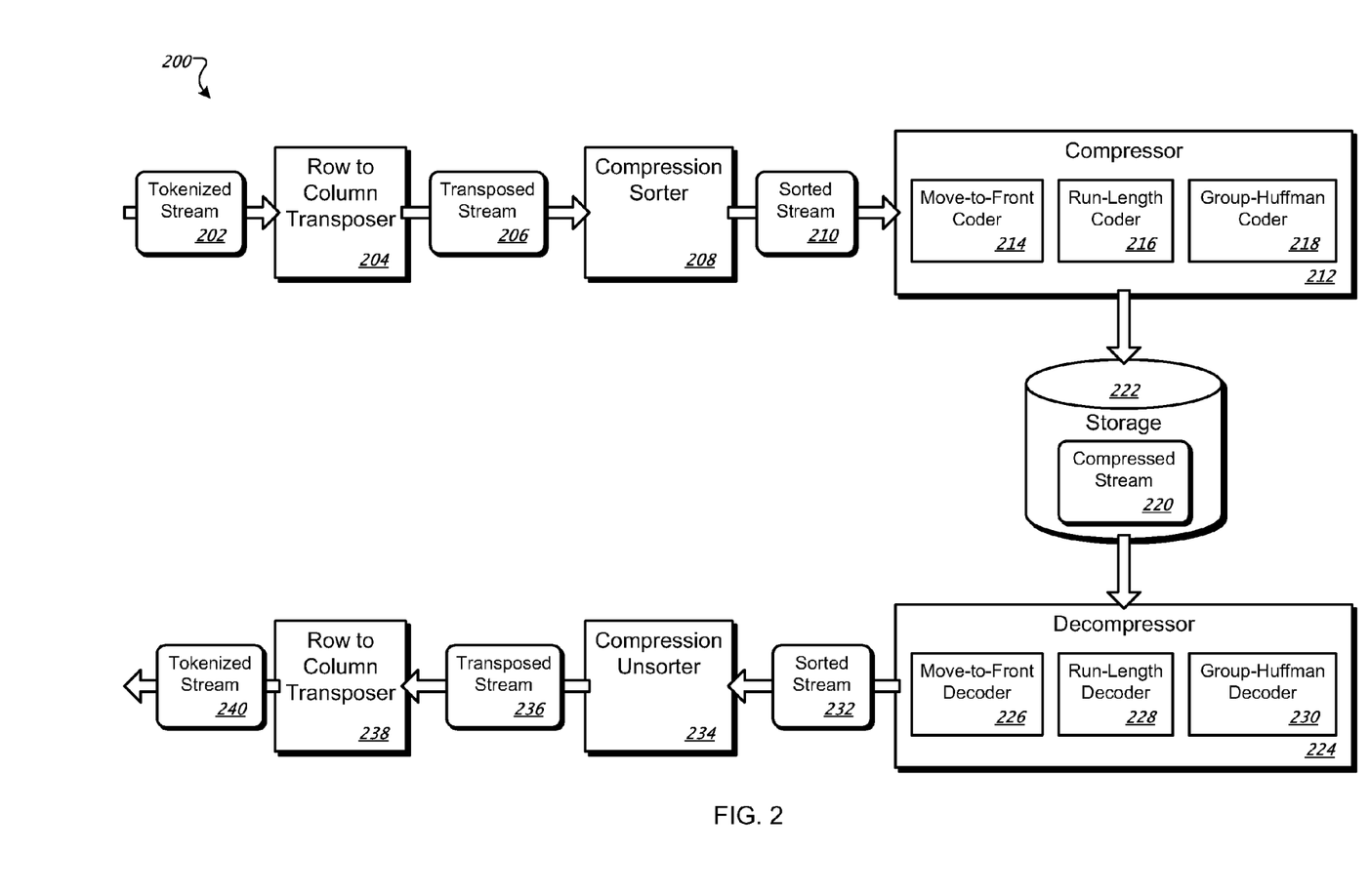
FIG. 2 is a block diagram of an example system for sorting and unsorting a tokenized stream.

FIG. 2 is a block diagram of an example system 200 for sorting and unsorting a tokenized stream. Other configurations of a system are possible, and the one shown is but one implementation. The system 200 receives a tokenized stream 202. In some implementations, the tokenized stream 202 includes multiple types of data. For illustrative purposes, the system 200 is described in terms of the following example. In this example, the tokenized stream 202 includes Internet browser usage information for one or more client computer devices, such as an identifier of the client (e.g., "a" or "b"), an IP address of the client (e.g., "1.1.1.1" and "2.2.2.2"), and the type of browser used (e.g., Firefox, Explorer, Maxthon, and Opera). Multiple users can access each client and each client can have multiple browser types installed. The browser used at a particular client can depend on the browsers installed at the client and the personal preference of the user. The browser usage tokenized stream 202 may be stored as text in "flat" files or the stream 202 may be stored as one or more tables in a database. The following is an example of contents within the stream 202:

| Client ID | IP Address | Browser |
|-----------|-----------|---------|
| A | 1.1.1.1 | Firefox |
| B | 2.2.2.2 | Explorer |
| A | 1.1.1.1 | Firefox |
| B | 1.1.1.1 | Maxthon |
| B | 2.2.2.2 | Explorer |
| A | 2.2.2.2 | Opera |
| A | 1.1.1.1 | Firefox |
| A | 1.1.1.1 | Firefox |
| B | 2.2.2.2 | Explorer |
| A | 1.1.1.1 | Firefox |
| B | 2.2.2.2 | Explorer |
| A | 1.1.1.1 | Firefox |

A row-to-column transposer 204 transposes the client ID column into a first token row, the IP address column into a second token row, and the browser column into a third token row. The row-to-column transposer 204 outputs a transposed token stream 206.

A compression sorter 206 performs a sort, for example, as described with respect to FIG. 2. The client ID token row is output as the following:

ABABBAAABABA

The client ID token row is sorted to obtain the following order:

AAAAAAABBBBB

The order of "AAAAAAABBBBB" can be represented using the following notation:

182910345116127

The notation above indicates that the token portion in the first position moves to the $1^{st}$ position, the token portion in the second position moves to the $8^{th}$ position, the token portion in the third position moves to the $2^{nd}$ position, the token portion in the fourth position moves to the $9^{th}$ position, the token portion in the fifth position moves to the $10^{th}$ position, the token portion in the sixth position moves to the $3^{rd}$ position, the token portion in the seventh position moves to the $4^{th}$ position, the token portion in the eighth position moves to the $5^{th}$ position, the token portion in the ninth position moves to the $11^{th}$ position, the token portion in the tenth position moves to the $6^{th}$ position, the token portion in the eleventh position moves to the $12^{th}$ position, and the token portion in the twelfth position moves to the $7^{th}$ position. The order "182910345116127" is applied to the IP address token row to determine the following output ("1.1.1.1" is abbreviated as "1" and "2.2.2.2" is abbreviated as "2"):

112111121222

The entire sorted output thus far of the browser usage stream is the following:

ABABBAAABABA 112111121222

The IP address token row is sorted to obtain the following order:

111111122222

The order of "111111122222" can be represented using the following notation (ties are broken using the order determined by sorting the client ID token row):

192710834115126

The following table illustrates the determination of the sorted order using the previous token to break ties:

| Client ID Token | A | B | A | B | B | A | A | A | B | A | B | A |
|---|---|---|---|---|---|---|---|---|---|---|---|---|
| IP Address Token | 1 | 2 | 1 | 1 | 2 | 2 | 1 | 1 | 2 | 1 | 2 | 1 |
| Order $1^{st}$ Step | 1 |   | 2 |   |   |   | 3 | 4 |   | 5 |   | 6 |
| Order $2^{nd}$ Step |   |   |   | 7 |   |   |   |   |   |   |   |   |
| Order $3^{rd}$ Step |   |   |   |   |   | 8 |   |   |   |   |   |   |
| Order $4^{th}$ Step |   | 9 |   |   | 10 |   |   |   | 11 |   | 12 |   |

IP address portions that have an address of "1.1.1.1" ("1") and a corresponding client ID of "A" are numbered in order. This accounts for the first portion that is moved to the $1^{st}$ position, the third position that is moved to the $2^{nd}$ position, the seventh portion that is moved to the $3^{rd}$ position, the eighth portion that is moved to the $4^{th}$ position, the tenth portion that is moved to the $5^{th}$ position, and the twelfth portion that is moved to the $6^{th}$ position. Next, IP addresses of "1.1.1.1" ("1") with a corresponding client ID of "B" are numbered. This accounts for the fourth portion that is moved to the $7^{th}$ position. Next, IP addresses of "2.2.2.2" ("2") having corresponding client IDs of "A" are numbered. This accounts for the sixth portion that is moved to the $8^{th}$ position. Lastly, IP addresses of "2.2.2.2" ("2") having corresponding client IDs of "B" are numbered. This accounts for the second portion that is moved to the $9^{th}$ position, the fifth portion that is moved to the $10^{th}$ position, the ninth portion that is moved to the $11^{th}$ position, and the eleventh portion that is moved to the $12^{th}$ position.

The "192710834115126" notation indicates that the token portion in the first position moves to the 1$^{st}$ position, the token portion in the second position moves to the 9$^{th}$ position, the token portion in the third position moves to the 2$^{nd}$ position, the token portion in the fourth position moves to the 7$^{th}$ position, the token portion in the fifth position moves to the 10$^{th}$ position, the token portion in the sixth position moves to the 8$^{th}$ position, the token portion in the seventh position moves to the 3$^{rd}$ position, the token portion in the eighth position moves to the 4$^{th}$ position, the token portion in the ninth position moves to the 11$^{th}$ position, the token portion in the tenth position moves to the 5$^{th}$ position, the token portion in the eleventh position moves to the 12$^{th}$ position, and the token portion in the twelfth position moves to the 6$^{th}$ position. The order "192710834115126" is applied to the browser token row to determine the following output (Firefox is abbreviated as F, Explorer as E, Maxthon as M, and Opera as O):

FFFFFFMOEEEE

The entire sorted output thus far of the browser usage stream is the following:

ABABBAAABABA 112111121222 FFFFFFMOEEEE

Here, the output of the second token has two portions that are not within a matching group, the "2" in the third position and the "1" in the ninth position. The output of the third token has no portions outside of a matching group. This example shows that where there is a correlation between two or more columns, the compression sort can approach the effects of an actual sort of the tokens.

Referring again to FIG. 2, the compression sorter 208 outputs a sorted tokenized stream 210 to a compressor 212. The compressor 212 can include one or more compression modules, and in the implementation shown includes a move-to-front coder 214, a run-length coder 216, and a Group-Huffman coder 218. The move-to-front coder 214 creates globally low entropy from regions of locally low entropy by moving recent characters to the front of an encoding array. An expanded version can be used that uses prediction to move additional characters to the front. The run-length coder 214 encodes runs of zeros by replacing them with a binary encoding using two special characters. This can achieve compression on the large runs of zeros generated by the move-to-front coder 214. The Group-Huffman coder 218 reduces string size to approach the string's 0$^{th}$ order entropy by assigning variable length prefix-free codes to every character. A clustering method can further be used, for example, the clustering method used in the bzip2 compressor.

The compressor 212 uses the compression modules to compress the sorted tokenized stream 210. The compressor 212 outputs a compressed tokenized stream 220. The compressed tokenized stream 220 may be stored, for example, in a storage device 222. A decompressor 224 may retrieve the compressed tokenized stream 222 for decompression. The decompressor 224 includes one or more decompression modules, such as a move-to-front decoder 226, a run-length decoder 228, and a Group-Huffman decoder 230. The decompressor 224 decompresses the compressed tokenized stream 222 and outputs a sorted tokenized stream 232.

A compression unsorter 234 unsorts the sorted tokenized stream 234. For example, the compression unsorter 234 can perform a reverse sort as described with respect to FIG. 2. The compression unsorter 234 outputs a transposed tokenized stream 236.

A row-to-column tranposer 238 transposes rows in the transposed tokenized stream 236 to columns. The row-to-column transposer 238 outputs a tokenized stream 240. In some implementations, the tokenized stream 240 is the same as the tokenized stream 202.

The compression sort described herein groups bytes (or other units of information) by the original columns of the bytes. The compression sort restricts the prefixes; for example, when sorting column x, the prefix can be a string of the content in a same row that is included in columns 1 to (x-1). This allows the compression sort to use radix sorting. The compression sort can reorder one column at a time, which restricts byte movement to a smaller range than suffix sorting and decreases cache misses. The compression sort can mirror a radix sort while rearranging input bytes. The compression sort can be performed in linear time. In some implementations, the compression sort stores two permutations or sort orders that are written back and forth as the compression sort iterates over the columns of data. The two permutations can include an array equal to the number of tokens in the tokenized input stream. For example, where a tokenized input stream includes repeats tokens (possibly with a variable length), there can be good prefix context for the compression sort and therefore good compression.

In some implementations, the tokenized input stream can be provided by a database or data table that stores blocks in column-major format. In some implementations, the block size of the compression sort can affect the cache-performance of the compression sort. For example, the block size can be chosen so that the permutation can fit within a memory cache. In some implementations, the size of the permutation is one integer per record or token and a typical record/token in a database can be hundreds or thousands of bytes long. Therefore, block-size can be orders or magnitude larger than cache-size while still allowing the permutation to be fully cached.

The invention and all of the functional operations described in this specification can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output.

The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language.

Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; a magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

To provide for interaction with a user, the invention can be implemented on a computer system having a display device such as a monitor or LCD screen for displaying information to the user and a keyboard and a pointing device such as a mouse or a trackball by which the user can provide input to the computer system. The computer system can be programmed to provide a graphical user interface through which computer programs interact with users.

Figure 3:
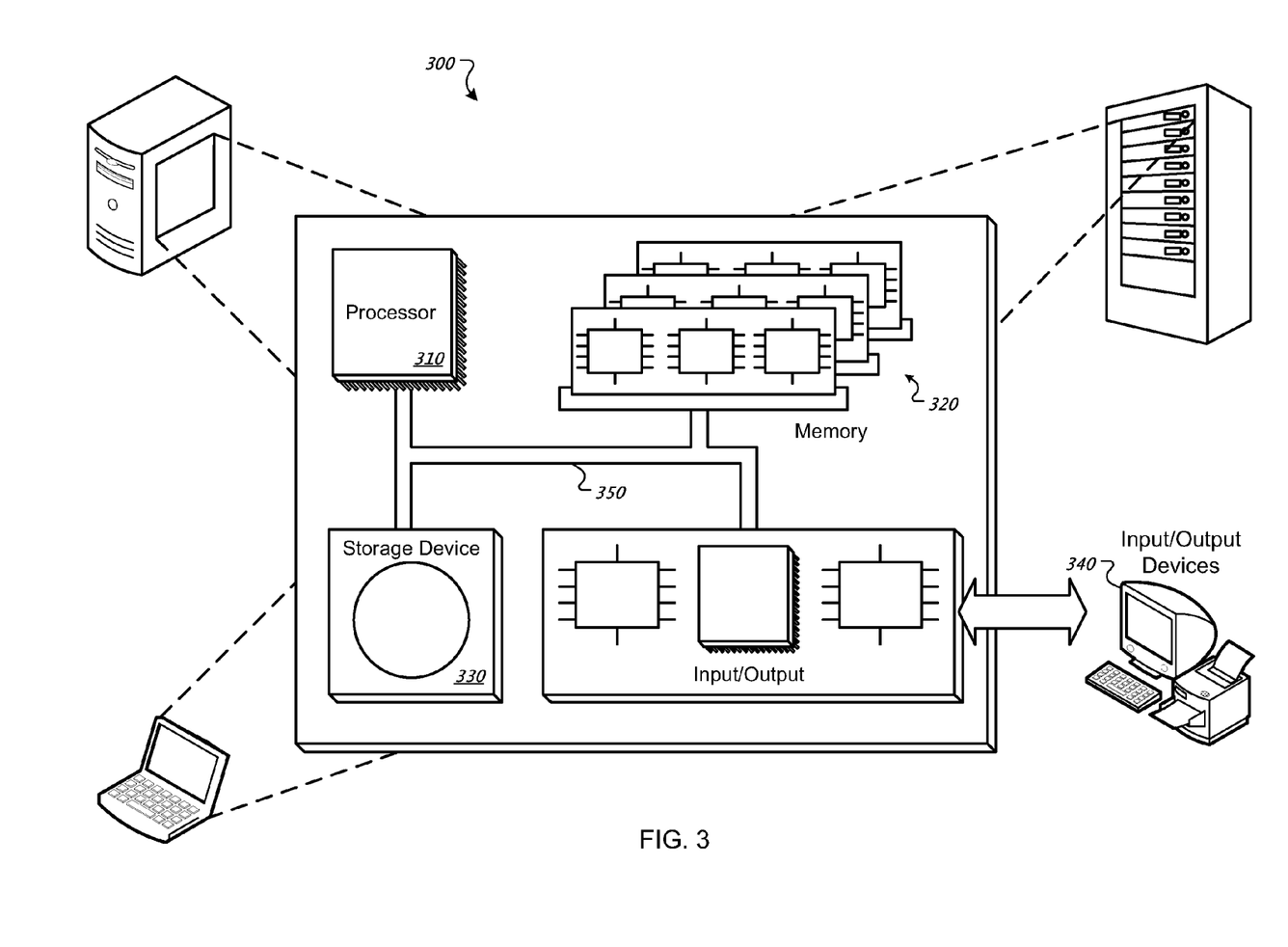
FIG. 3 is a schematic diagram of an example computer system.

Referring now to FIG. 3, a schematic diagram of an example computer system 300 is shown. The system 300 can be used for the operations described in association with the process 100 and the system 200 shown in FIGS. 1 and 2, according to one implementation. For example, one or more of the systems 300 can be used to implement a server hosting the compression sorter 208 or the compression unsorter 234.

The system 300 includes a processor 310, a memory 320, a storage device 330, and an input/output device 340. Each of the components 310, 320, 330, and 340 can, for example, be interconnected using a system bus 350. The processor 310 is capable of processing instructions for execution within the system 300. In one implementation, the processor 310 is a single-threaded processor. In another implementation, the processor 310 is a multi-threaded processor. The processor 310 is capable of processing instructions stored in the memory 320 or on the storage device 330 to display graphical information for a user interface on the input/output device 340. In some embodiments, a parallel processing set of systems 300 connected over a network may be employed, clustered into one or more server centers.

The memory 320 stores information within the system 300. In one implementation, the memory 320 is a computer-readable medium. In one implementation, the memory 320 is a volatile memory unit. In another implementation, the memory 320 is a non-volatile memory unit.

The storage device 330 is capable of providing mass storage for the system 300. In one implementation, the storage device 330 is a computer-readable medium. In various different implementations, the storage device 330 can, for example, include a hard disk device, an optical disk device, or some other large capacity storage device.

The input/output device 340 provides input/output operations for the system 300. In one implementation, the input/output device 340 includes a keyboard and/or pointing device. In another implementation, the input/output device 340 includes a display unit for displaying graphical user interfaces.

A number of embodiments of the invention have been described. Nevertheless, it will be understood that various modifications may be made without departing from the spirit and scope of the invention. Accordingly, other embodiments are within the scope of the following claims.

What is claimed is:

1. A computer-implemented method comprising:
   (a) receiving a tokenized stream of content including n tokens;
   (b) arranging the content into c columns and n rows, where c is a maximum token length of the n tokens included in the stream and each row comprises one of the n tokens;
   (c) determining a first sort order based on a sort of a first column;
   (d) applying the first sort order to reorder a second column;
   (e) repeating steps (c) and (d) to determine a sort order based on one column and applying the sort order to reorder another column until the $c^{th}$ column has been reordered by a $(c-1)^{th}$ sort order;
   wherein c and n are whole numbers and wherein each column is reordered independently such that the n tokens do not remain intact and are dispersed during reordering.

2. The method of claim 1, wherein an $i^{th}$ column includes an $i^{th}$ byte of a token in the stream.

3. The method of claim 1, wherein an $i^{th}$ column includes an $i^{th}$ portion of a multi-portioned token in the stream.

4. The method of claim 3, where the $i^{th}$ portion comprises a text string.

5. The method of claim 3, where the $i^{th}$ portion comprises a numeric string.

6. The method of claim 1, wherein determining a sort order based on a sort of a column includes resolving a tie based on a sort order of a previous column.

7. The method of claim 1, where the stream includes n fixed-length tokens having a length c.

8. The method of claim 1, where the stream includes n variable-length tokens, each token having a length not greater than c.

9. The method of claim 1, further comprising:
   providing an output stream comprising the sorted columns arranged as a string.

10. The method of claim 9, further comprising:
    providing the output stream to a compressor.

11. The method of claim 9, further comprising:
    providing the output stream to a move-to-front coder to generate a second output;
    providing the second output to a run-length coder to generate a third output; and
    providing the third output to a Group-Huffman coder to generate a fourth output.

12. A computer implemented method for sorting a tokenized stream, comprising:
    (a) receiving a tokenized stream including n tokens, each token comprising two or more portions;
    (b) determining a first sort order based on a sort of a set of the first portions of the n tokens;
    (c) applying the first sort order to reorder a set of the second portions of the n tokens;
    (d) repeating steps (b) and (c) to determine a sort order based on a set of portions of the n tokens and apply the sort order to reorder another set of portions of the n tokens column until a $c^{th}$ set of portions been reordered by a $(c-1)^{th}$ sort order, where c is a desired number of sets to be sorted;
    wherein c and n are whole numbers and wherein for each token each portion of the token is reordered independent of the one or more other portions in the token such that the n tokens do not remain intact and are dispersed during reordering.

13. A computer-implemented method for sorting a tokenized stream, comprising:
    receiving a tokenized stream of content including n tokens;
    arranging the content into a matrix of c columns and n rows, where c is a maximum token length of the n tokens and each row comprises one of the n tokens;
    reordering each of (c−1) of the columns, where each reordering is based on sort orders of all previously reordered columns in the matrix;
    wherein each column is reordered independently such that the n tokens do not remain intact and are dispersed during the reordering and c and n are whole numbers.

14. The method of claim 13, wherein an $i^{th}$ column includes the $i^{th}$ byte of tokens in the stream.

15. The method of claim 13, wherein an $i^{th}$ column includes an $i^{th}$ portion of a multi-portioned token in the stream.

16. The method of claim 15, where the $i^{th}$ portion comprises a text string.

17. The method of claim 15, where the $i^{th}$ portion comprises a numeric string.

18. The method of claim 13, wherein reordering (c−1) of the columns based on sort-orders of all previous columns includes resolving a tie based on an order of an adjacent previously-ordered column.

19. The method of claim 13, wherein reordering (c−1) of the columns based on sort-orders of all previous columns comprises:
(a) determining an $x^{th}$ sort order based on a sort of an $x^{th}$ column;
(b) applying the $x^{th}$ sort order to reorder an adjacent $(x+1)^{th}$ column; and
(c) repeating steps (a) and (b) until the $c^{th}$ column has been reordered by a $(c-1)^{th}$ order;
where x is a whole number.

20. A system comprising:
one or more processors;
a storage device coupled to the one or more processors and configurable for storing instructions, which, when executed by the one or more processors cause the one or more processors to perform compression sorting and compression operations comprising:
receiving at a compression sorter a tokenized stream of b bytes including n tokens;
arranging the b bytes into a matrix of c columns by n rows, where c is a maximum token length of the n tokens and each row comprises one of the n tokens;
reordering each of (c−1) of the columns, where each reordering is based on sort orders of all previously reordered columns in the matrix; and
providing to a compressor an output stream comprising the reordered columns;
receiving at the compressor the output stream and compressing the output stream;
wherein each column is reordered independently such that the n tokens do not remain intact and are dispersed during the reordering and b, c and n are whole numbers.

21. The system of claim 20, wherein the compressor includes a move-to-front coder.

22. The system of claim 21, wherein the compressor further includes a run-length coder.

23. The system of claim 22, wherein the compressor further includes a Group-Huffman coder.

24. A system comprising:
a processor;
a storage device coupled to the processor and configurable for storing instructions, which, when executed by the processor, cause the processor to perform operations comprising:
(a) receiving a tokenized stream of content including n tokens;
(b) arranging the content into c columns and n rows, where c is a maximum token length of the n tokens included in the stream and each row comprises one of the n tokens;
(c) determining a first sort order based on a sort of a first column;
(d) applying the first sort order to reorder a second column;
(e) repeating steps (c) and (d) to determine a sort order based on one column and applying the sort order to reorder another column until the $c^{th}$ column has been reordered by a $(c-1)^{th}$ sort order;
wherein c and n are whole numbers and wherein each column is reordered independently such that the n tokens do not remain intact and are dispersed during reordering.

25. The system of claim 24, wherein an $i^{th}$ column includes an $i^{th}$ byte of a token in the stream.

26. The system of claim 24, wherein an $i^{th}$ column includes an $i^{th}$ portion of a multi-portioned token in the stream.

27. The system of claim 26, where the $i^{th}$ portion comprises a text string.

28. The system of claim 26, where the $i^{th}$ portion comprises a numeric string.

29. The system of claim 24, wherein determining a sort order based on a sort of a column includes resolving a tie based on a sort order of a previous column.

30. The system of claim 24, where the stream includes n fixed-length tokens having a length c.

31. The system of claim 24, where the stream includes n variable-length tokens, each token having a length not greater than c.

32. The system of claim 24, the storage device further including instructions, which, when executed by the processor, cause the processor to perform operations further comprising:
providing an output stream comprising the sorted columns arranged as a string.

33. The system of claim 32, the storage device further including instructions, which, when executed by the processor, cause the processor to perform operations further comprising:
providing the output stream to a compressor.

34. The system of claim 32, the storage device further including instructions, which, when executed by the processor, cause the processor to perform operations further comprising:
providing the output stream to a move-to-front coder to generate a second output;
providing the second output to a run-length coder to generate a third output; and
providing the third output to a Group-Huffman coder to generate a fourth output.

35. A computer readable medium having instructions stored thereon, which, when executed by a processor, cause the processor to perform operations comprising:
(a) receiving a tokenized stream of content including n tokens;
(b) arranging the content into c columns and n rows, where c is a maximum token length of the n tokens included in the stream and each row comprises one of the n tokens;
(c) determining a first sort order based on a sort of a first column;
(d) applying the first sort order to reorder a second column;
(e) repeating steps (c) and (d) to determine a sort order based on one column and applying the sort order to reorder another column until the $c^{th}$ column has been reordered by a $(c-1)^{th}$ sort order;
wherein c and n are whole numbers and wherein each column is reordered independently such that the n tokens are dispersed during reordering.

36. The computer readable medium of claim 35, wherein an $i^{th}$ column includes $i^{th}$ byte of a token in the stream.

37. The computer readable medium of claim 35, wherein an $i^{th}$ column includes $i^{th}$ portion of a multi-portioned token in the stream.

38. The computer readable medium of claim 37, where the $i^{th}$ portion comprises a text string.

39. The computer readable medium of claim 37, where the $i^{th}$ portion comprises a numeric string.

40. The computer readable medium of claim 35, wherein determining a sort order based on a sort of a column includes resolving a tie based on a sort order of a previous column.

41. The computer readable medium of claim 35, where the stream includes n fixed-length tokens having a length c.

42. The computer readable medium of claim 35, where the stream includes n variable-length tokens, each token having a length not greater than c.

43. The computer readable medium of claim 35, further including instructions, which, when executed by the processor, cause the processor to perform operations further comprising:

provoking an output stream comprising the sorted columns arranged as a string.

44. The computer readable medium of claim 43, the storage device further including instructions, which, when executed by the processor, cause the processor to perform operations further comprising:

providing the output stream to a compressor.

45. The computer readable medium of claim 43, the storage device further including instructions, which, when executed by the processor, cause the processor to perform operations further comprising:

providing the output stream to a move-to-front coder to generate a second output;

providing the second output to a run-length coder to generate a third output; and providing the third output to a Group-Huffman coder to generate a fourth output.

* * * * *